United States Patent
Kozlova et al.

(10) Patent No.: US 11,474,858 B2
(45) Date of Patent: Oct. 18, 2022

(54) PARALLEL MULTISCALE RESERVOIR SIMULATION

(71) Applicant: Schlumberger Technology Corporation, Sugar Land, TX (US)

(72) Inventors: Antonina Kozlova, Tyumen (RU); Jostein Natvig, Verk (NO); Dominic Walsh, Oxford (GB); Kyrre Bratvedt, Katy, TX (US); Sindhu Chittireddy, Houston, TX (US); Zhuoyi Li, Houston, TX (US); Shingo Watanabe, Houston, TX (US)

(73) Assignee: Schlumberger Technology Corporation, Sugar Land, TX (US)

( * ) Notice: Subject to any disclaimer, the term of this patent is extended or adjusted under 35 U.S.C. 154(b) by 989 days.

(21) Appl. No.: 16/306,894

(22) PCT Filed: Jun. 22, 2017

(86) PCT No.: PCT/US2017/038649
§ 371 (c)(1),
(2) Date: Dec. 3, 2018

(87) PCT Pub. No.: WO2018/005214
PCT Pub. Date: Jan. 4, 2018

(65) Prior Publication Data
US 2021/0032972 A1 Feb. 4, 2021

Related U.S. Application Data

(60) Provisional application No. 62/355,748, filed on Jun. 28, 2016.

(51) Int. Cl.
*G06F 3/00* (2006.01)
*G06F 9/48* (2006.01)
*G06F 9/38* (2018.01)

(52) U.S. Cl.
CPC .......... *G06F 9/4881* (2013.01); *G06F 9/3836* (2013.01)

(58) Field of Classification Search
CPC ................................ G06F 9/3836; G06F 30/20
See application file for complete search history.

(56) References Cited

U.S. PATENT DOCUMENTS 6,826,520 B1 * 11/2004 Khan ...................... E21B 43/00
  702/9
9,797,225 B2 * 10/2017 Chavez ................... H03M 7/70
(Continued)

OTHER PUBLICATIONS

Mary F. Wheeler, A Parallel Multiblock/Multidomain Approach for Reservoir Simulation. (Year: 1999).*
T. Berning and N. Djilali, A 3D, Multiphase, Multicomponent Model of the Cathode and Anode of a PEM Fuel Cell. (Year: 2003).*

(Continued)

*Primary Examiner* — Lechi Truong

(57) ABSTRACT

Systems, computer-readable media, and methods for performing a reservoir simulation by obtaining reservoir data; translating the reservoir data into grid properties to create a grid; dividing the grid into domains; generating coarse grids corresponding to each domain; processing the domains, where processing a domain includes: calculating pressure for the domain using a coarse grid corresponding to the domain, calculating flux for the domain using a coarse grid corresponding to the domain, and calculating transport of fluids for the domain using a coarse grid corresponding to the domain; and generating a reservoir simulation corresponding to the grid based on processing each domain. The domains can be processed in parallel on different computer systems, different processors, or different cores.

20 Claims, 5 Drawing Sheets

(56) References Cited

U.S. PATENT DOCUMENTS

| | | | |
|---|---|---|---|
| 2007/0244676 A1* | 10/2007 | Shang | G06F 30/23 703/2 |
| 2012/0000669 A1 | 1/2012 | Wu et al. | |
| 2012/0159124 A1* | 6/2012 | Hu | G06F 12/0842 711/119 |
| 2013/0118736 A1 | 5/2013 | Usadi et al. | |
| 2013/0184638 A1* | 7/2013 | Scarpaci | A61M 1/3656 604/28 |
| 2013/0211800 A1 | 8/2013 | Fung | |
| 2013/0246030 A1 | 9/2013 | Usadi et al. | |
| 2013/0325419 A1* | 12/2013 | Al-Shaikh | G06F 9/5066 703/2 |
| 2014/0039853 A1 | 2/2014 | Fung | |
| 2014/0088934 A1* | 3/2014 | Liang | G06F 30/20 703/2 |
| 2015/0134314 A1* | 5/2015 | Lu | E21B 47/00 703/10 |
| 2015/0338550 A1* | 11/2015 | Wadsley | E21B 43/00 703/2 |

OTHER PUBLICATIONS

International Search Report and Written Opinion for the equivalent International patent application PCT/US2017/038649 dated Sep. 29, 2017.

International Preliminary Report on Patentability for the equivalent International patent application PCT/US2017/038649 dated Jan. 10, 2019.

Aarnes, et al., "Mixed Multiscale Finite Elements and Streamline Methods for Reservoir Simulation of Large Geomodels," Advances in Water Resources, 2005, 28(3), 257-271.

Aarnes, et al., "A Hierarchical Multiscale Method for Two-Phase Flow Based Upon Mixed Finite Elements and Nonuniform Coarse Grids," Multiscale Modeling & Simulation, 2006, 5(2), pp. 337-363.

Aarnes, et al., "Multiscale mixed/mimetic methods on corner-point grids," Computational Geosciences, 2008, 12(3), pp. 297-315.

Batycky, et al., "Parallelization of A Commercial Streamline Simulator and Performance on Practical Models," Jun. 2010 SPE Reservoir Evaluation & Engineering, pp. 383-390.

Beckner, et al., "General Parallel Reservoir Simulation," Abu Dhabi International Petroleum Exhibition and Conference held in Abu Dhabi, UAE, Nov. 9-12, 2015.

Cao, et al., "Parallel Scalable Unstructured CPR-Type Linear Solver for Reservoir Simulation," 2005 SPE Annual Technical Conference and Exhibition held in Dallas, TX USA, Oct. 9-12, 2005.

Chen, et al., "A mixed multiscale finite element method for elliptic problems with oscillating coefficients," Mathematics of Computation, vol. 72, Issue 242, Apr. 1, 2003, pp. 541-576.

DeBaun, et al., "An Extensible Architecture for Next Generation Scalable Parallel Reservoir Simulation," 2005 SPE Reservoir Simulation Symposium, Jan. 31-Feb. 2, The Woodlands, Texas, USA. SPE 93274.

Dogru, et al., "A Next-Generation Parallel Reservoir Simulator for Giant Reservoirs," 2009, SPE Reservoir Simulation Symposium in The Woodlands, Tx USA Feb. 2-4, 2009.

Dogru, et al., "A Massively Parallel Reservoir Simulator for Large Scale Reservoir Simulation," 1999 SPE Reservoir Simulation Symposium held in Houston, TX Feb. 14-17, 1999.

Dzyuba, et al., "Advances in Modeling of Giant Reservoirs," Mathematical Methods in Fluid Dynamics and Simulation of Giant Oil and Gas Reservoir held in Istanbul, Turkey, Sep. 3-5, 2012.

Fjerstad, et al., "Next Generation Parallel Computing for Large-Scale Reservoir Simulation," SPE International mproved Oil Recovery Conference in Asia Pacific held in Kuala Lumpur, Malaysia, Dec. 5-6, 2005.

Fung, et al., "Parallel Unstructured Solver Methods for Complex Giant Reservoir Simulation," 2007, SPE Reservoir Simulation Symposium held in Houston, TX USA Feb. 26-28, 2007.

Fung, et al., "Parallel-Simulator Framework for Multipermeability Modeling With Discrete Fractures for Unconventional and Tight Gas Reservoirs," Aug. 2016 SPE Journal, pp. 1370-1385.

Gaupass, et al., "A Parallel Streamline Simulator for Integrated Reservoir Modeling on a Desktop," EAGE Annual Conference & Exhibition incorporating SPE Europec held in Copenhagen, Denmark, Jun. 4-7, 2012.

Gilman, et al., "Unconventional Reservoir Model Predictions Using Massively-Parallel GPU Flow-Simulation: Part-1 Bakken Reservoir Characterization Choices and Parameter Testing," Unconventional Resources Technology Conference held in San Antonio, TX USA, Jul. 20-22, 2015.

Gratien, et al., "Scalability and Load-Balancing Problems in Parallel Reservoir Simulation," 2007 SPE Reservoir Simulation Symposium held in Houston, TX USA Feb. 26- 28, 2007.

Hajibeygi, et al., "Multiscale finite-volume method for parabolic problems arising from compressible multiphase flow in porous media," 2009, Journal of Computational Physics, 228 (14), 5129-5147.

Hajibeygi, et al., "Compositional Multiscale Finite-Volume Formulation," SPE Reservoir Simulation Symposium held in The woodlands, TX USA, Feb. 18-20, 2013.

Hou, et al., "A multiscale finite element method for elliptic problems in composite materials and porous media," 1997, Journal of Computational Physics, 134, 169-189.

Jaure et al., "Reservoir Simulation Prototyping Platform for High Performance Computing," SPE Large Scale Computing and Big Data Challenges in Reservoir Simulation Conference and Exhibition held in Istanbul, Turkey, Sep. 15 -17, 2014.

Jenny, et al., "Multi-scale finite-volume method for elliptic problems in subsurface flow simulation," 2003, Journal of Computational Physics, 187, 47-67.

Jenny, et al., "Adaptive fully implicit multiscale finite-volume method for multi-phase flow and transport in heterogeneous porous media," 2006, Journal of Computational Physics, 217, 627-641.

Kozlova, et al., "A Real-Field Multiscale Black-Oil Reservoir Simulator," SPE Reservoir Simulation Symposium held in Houston, TX USA, Feb. 23-25, 2015, Houston, Texas, USA.

Krogstad, et al., "A Multiscale Mixed Finite-Element Solver for Three-Phase Black-Oil Flow," 2009 SPE Reservoir Simulation Symposium held in The Woodlands, TX, USA, Feb. 2-4, 2009.

Lee, et al., "Multiscale Finite-volume Formulation for Multiphase Flow in Porous Media: Black Oil Formulation of Compressible, Three Phase Flow with Gravity," Computational Geosciences, 2008, 12 (3), pp. 351-366.

Lie, et al., "Successful Application of Multiscale Methods in a Real Reservoir Simulator Environment," ECMOR XV—15th European Conference on the Mathematics of Oil Recovery. EAGE, Aug. 29-Sep. 1, 2016, Amsterdam, The Netherlands.

Liu, et al., "A Parallel Framework for Reservoir Simulators on Distributed-Memory Supercomputers," SPE/IATMI Asia Pacific Oil & Gas Conference and Exhitibion held in Nusa Dua, Bali, Indonesia, Oct. 20-22, 2015.

Lof, et al., "Parallel Streamline Simulation," 2008 SPE Europec/EAGE Annual Conference and Exhibition held in Rome, Italy, Jun. 9-12, 2008.

Lunati, et al., "Multiscale finite-volume method for compressible multiphase flow in porous media," 2006, Journal of Computational Physics, 216 (2):616-636.

Lunati, et al., "Multiscale finite-volume method for density-driven flow in porous media," 2008, Computational Geosciences, 12 (3), pp. 337-350.

Lunati, et al., "An iterative multiscale finite volume algorithm converging to the exact solution," 2011, Journal of Computational Physics, 230 (5), 1849-1864.

Manea, et al., "Parallel Multiscale Linear Solver for Highly Detailed Reservoir Models," SPE Reservoir Simulation Symposium held in Houston, TX USA Feb. 23-25, 2015.

Møyner, et al., "A multiscale method based on restriction-smoothed basis functions suitable for general grids in high contrast media," 2015, SPE paper 173265 presented at the SPE Reservoir Simulation Symposium held in Houston, Texas, USA, Feb. 23-25, 2015.

(56) References Cited

OTHER PUBLICATIONS

Møyner, et al., "The Multiscale Finite volume Method on Unstructured Grids," SPE Reservoir Simulation Symposium, The Woodlands, TX, USA, Feb. 18-20, 2013.
Møyner, et al., "The Multiscale Finite-volume Method on Stratigraphic Grids," 2014, SPE Journal, 19(5), pp. 816-831.
Møyner, et al., "A Multiscale Restriction-Smoothed Basis Method for Compressible Black-Oil Models," Dec. 2016 SPE Journal, pp. 2079-2096.
Møyner, et al., "A Multiscale Restriction-Smoothed Basis Method for High Contrast Porous Media Represented on Unstructured Grids," 2016, Journal of Computational Physics, 304, 46-71.
Mukundakrishnan, et al., "Accelerating Tight Reservoir Workflows With GPUs," SPE Reservoir Simulation Symposium held in Houston, TX USA Feb. 23-25, 2015.
OpenMP Architecture Review Board: "OpenMP C/C++ Specification v2.0," 2002, retrieved at .openmp.org.
Shahvali, et al., "Unconventional Reservoir Model Predictions Using Massively-Parallel Flow-Simulation: Bakken/Three Forks Reservoir Development Cases and SRV Testing," SPE Low Perm Symposium held in Denver, Colorado, USA May 5-6, 2016.
Wang, et al., "Algebraic multiscale solver for flow in heterogeneous porous media," 2014, Journal of Computational Physics, 259, 284-303.
Zhou, et al., "Operator-Based Multiscale Method For Compressible Flow," Jun. 2008 SPE Journal, 13 (2), pp. 267-273.
Zhou, et al., "Two-Stage Algebraic Multiscale Linear Solver for Highly Heterogeneous Reservoir Models," 2011 SPE Reservoir Simulation Symposium held in Woodland, TX USA Feb. 21-23, 2011.

\* cited by examiner

PARALLEL MULTISCALE RESERVOIR SIMULATION

This application claims priority to and the benefit of a U.S. Provisional Application having Ser. No. 62/355,748 filed on 28 Jun. 2016, which is incorporated by reference herein.

BACKGROUND

Reservoir simulations use computer models to predict the flow of fluids (e.g., oil, water, or gas) through porous media in a reservoir. Reservoir simulation can provide information that allows engineers to maximize the recovery within the oil and gas reservoirs, for example, forecasting reservoir production, informing the selection of wellbore trajectories and locations, informing the selection of injection pressures, etc.

Reservoir simulations can be computationally expensive, and, thus, can take large amounts of time to perform, particularly when many timesteps are calculated, and/or short interval timesteps are calculated. Accordingly, organizations desire systems and methods that can perform reservoir simulations more efficiently (e.g., using fewer processing resources, in shorter amounts of time, using less memory, etc.).

SUMMARY

Systems, apparatus, computer-readable media, and methods are disclosed, of which the methods include obtaining reservoir data; translating the reservoir data into grid properties to create a grid; dividing the grid into domains; generating coarse grids corresponding to each domain; processing the domains, where processing a domain includes: calculating pressure for the domain using a coarse grid corresponding to the domain, calculating flux for the domain using a coarse grid corresponding to the domain, and calculating transport of fluids for the domain using a coarse grid corresponding to the domain; and generating a reservoir simulation corresponding to the grid based on processing each domain.

In some embodiments, calculating pressure, flux, and transport of fluids for each domain can represent a single timestep where multiple timesteps are performed.

In other embodiments, the grid is divided into a number of domains that corresponds to at least one of a number of available computer systems, a number of available processors, and a number of available cores.

In further embodiments, generating the coarse grids corresponding to each domain can include generating coarse grids of different granularities for each domain.

In some implementations, processing each domain comprises processing the domains in parallel on at least one of different computer systems, different processors, or different cores.

In other implementations, processing each domain can include communicating information between the different computer systems, different processors, or different cores during the calculating the pressure, the flux, and the transport of fluids.

In further implementations, calculating the pressure, the flux, and the transport of fluids for each domain can include spawning threads for processing using multiple cores, the threads can be scheduled for execution on the cores using an operating system scheduler or a threading technology scheduler, and the threads can utilize shared memory of a processor corresponding to the cores.

Systems and apparatus are also disclosed that include a processor and a memory system with non-transitory, computer-readable media storing instructions that, when executed by the processor, causes the systems and apparatus to perform operations that include obtaining reservoir data; translating the reservoir data into grid properties to create a grid; dividing the grid into domains; generating coarse grids corresponding to each domain; processing the domains, where processing a domain includes: calculating pressure for the domain using a coarse grid corresponding to the domain, calculating flux for the domain using a coarse grid corresponding to the domain, and calculating transport of fluids for the domain using a coarse grid corresponding to the domain; and generating a reservoir simulation corresponding to the grid based on processing each domain.

Non-transitory, computer-readable media are also disclosed that store instructions that, when executed by a processor of a computing system, cause the computing system to perform operations that include obtaining reservoir data; translating the reservoir data into grid properties to create a grid; dividing the grid into domains; generating coarse grids corresponding to each domain; processing the domains, where processing a domain includes: calculating pressure for the domain using a coarse grid corresponding to the domain, calculating flux for the domain using a coarse grid corresponding to the domain, and calculating transport of fluids for the domain using a coarse grid corresponding to the domain; and generating a reservoir simulation corresponding to the grid based on processing each domain.

The foregoing summary is intended merely to introduce a subset of the aspects of the present disclosure, and is not intended to be exhaustive or in any way identify any particular elements as being more relevant than any others. This summary, therefore, should not be considered limiting on the present disclosure or the appended claims.

BRIEF DESCRIPTION OF THE DRAWINGS

The accompanying drawings, which are incorporated in and constitute a part of this specification, illustrate embodiments of the present teachings and together with the description, serve to explain the principles of the present teachings. In the figures.

DETAILED DESCRIPTION

Reference will now be made in detail to embodiments, examples of which are illustrated in the accompanying drawings and figures. In the following detailed description, numerous specific details are set forth in order to provide a thorough understanding of the disclosure. However, it will be apparent to one of ordinary skill in the art that certain embodiments of the disclosure may be practiced without these specific details. In other instances, well-known methods, procedures, components, circuits, and networks have not been described in detail so as not to unnecessarily obscure aspects of the embodiments.

It will also be understood that, although the terms first, second, etc. may be used herein to describe various elements, these elements should not be limited by these terms. These terms are used to distinguish one element from another. For example, a first object or step could be termed a second object or step, and, similarly, a second object or step could be termed a first object or step, without departing from the scope of the disclosure. The first object or step, and the second object or step, are both, objects or steps, respectively, but they are not to be considered the same object or step.

The terminology used in the description herein is for the purpose of describing particular embodiments and is not intended to be limiting. As used in the description and the appended claims, the singular forms "a," "an" and "the" are intended to include the plural forms as well, unless the context clearly indicates otherwise. It will also be understood that the term "and/or" as used herein refers to and encompasses any possible combinations of one or more of the associated listed items. It will be further understood that the terms "includes," "including," "comprises" and/or "comprising," when used in this specification, specify the presence of stated features, integers, steps, operations, elements, and/or components, but do not preclude the presence or addition of one or more other features, integers, steps, operations, elements, components, and/or groups thereof. Further, as used herein, the term "if" may be construed to mean "when" or "upon" or "in response to determining" or "in response to detecting," depending on the context.

Attention is now directed to processing procedures, methods, techniques, and workflows that are in accordance with some embodiments. Some operations in the processing procedures, methods, techniques, and workflows disclosed herein may be combined and/or the order of some operations may be changed.

Figure 1:
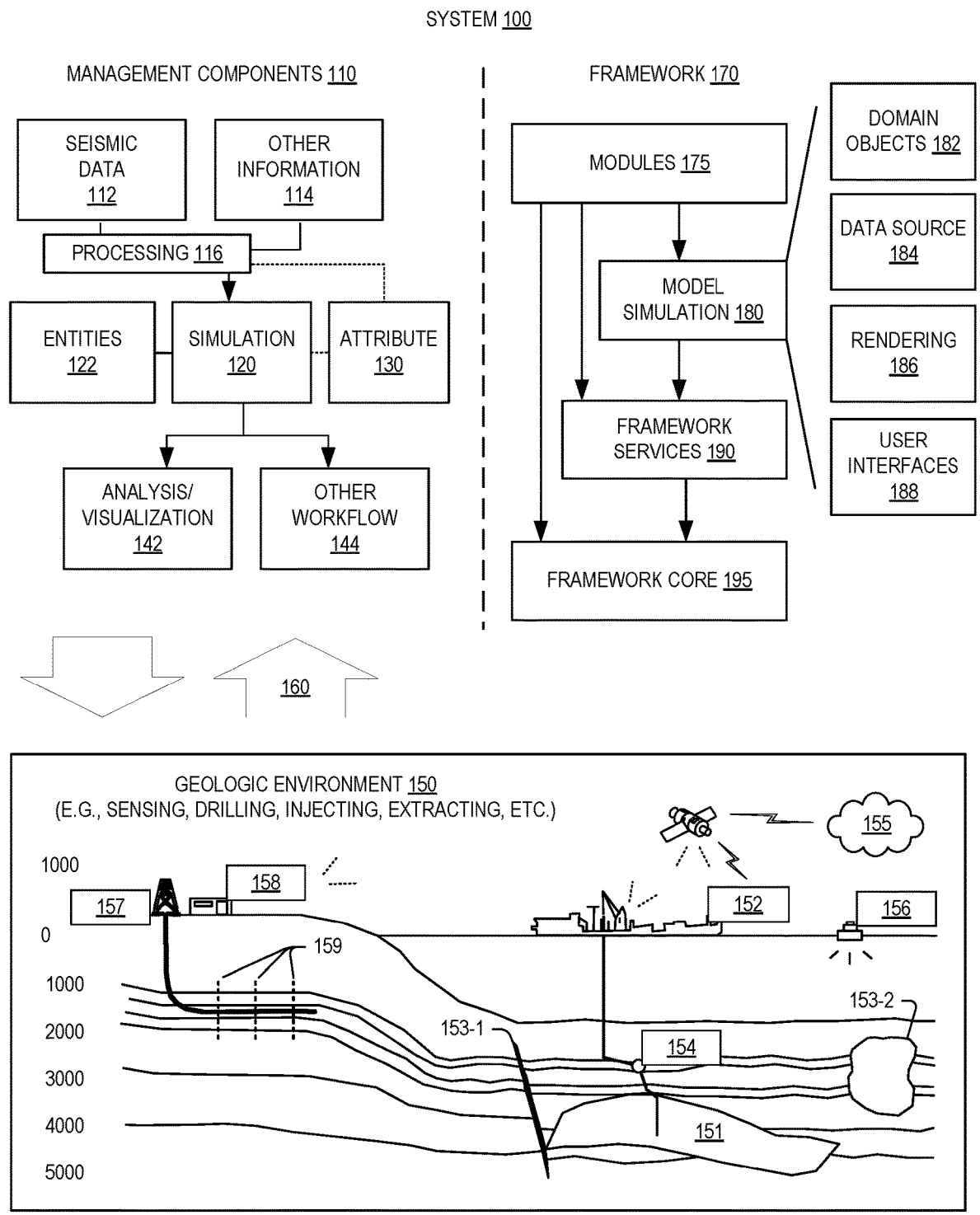
FIG. 1 illustrates an example of a system that includes various management components to manage various aspects of a geologic environment, according to an embodiment.

FIG. 1 illustrates an example of a system 100 that includes various management components 110 to manage various aspects of a geologic environment 150 (e.g., an environment that includes a sedimentary basin, a reservoir 151, one or more faults 153-1, one or more geobodies 153-2, etc.). For example, the management components 110 may allow for direct or indirect management of sensing, drilling, injecting, extracting, etc., with respect to the geologic environment 150. In turn, further information about the geologic environment 150 may become available as feedback 160 (e.g., optionally as input to one or more of the management components 110).

In the example of FIG. 1, the management components 110 include a seismic data component 112, an additional information component 114 (e.g., well/logging data), a processing component 116, a simulation component 120, an attribute component 130, an analysis/visualization component 142, and a workflow component 144. In operation, seismic data and other information provided per the components 112 and 114 may be input to the simulation component 120.

In an example embodiment, the simulation component 120 may rely on entities 122. Entities 122 may include earth entities or geological objects such as wells, surfaces, bodies, reservoirs, etc. In the system 100, the entities 122 can include virtual representations of actual physical entities that are reconstructed for purposes of simulation. The entities 122 may include entities based on data acquired via sensing, observation, etc. (e.g., the seismic data 112 and other information 114). An entity may be characterized by one or more properties (e.g., a geometrical pillar grid entity of an earth model may be characterized by a porosity property). Such properties may represent one or more measurements (e.g., acquired data), calculations, etc.

In an example embodiment, the simulation component 120 may operate in conjunction with a software framework such as an object-based framework. In such a framework, entities may include entities based on pre-defined classes to facilitate modeling and simulation. A commercially available example of an object-based framework is the MICROSOFT® .NET® framework (Redmond, Wash.), which provides a set of extensible object classes. In the .NET® framework, an object class encapsulates a module of reusable code and associated data structures. Object classes can be used to instantiate object instances for use by a program, script, etc. For example, borehole classes may define objects for representing boreholes based on well data.

In the example of FIG. 1, the simulation component 120 may process information to conform to one or more attributes specified by the attribute component 130, which may include a library of attributes. Such processing may occur prior to input to the simulation component 120 (e.g., consider the processing component 116). As an example, the simulation component 120 may perform operations on input information based on one or more attributes specified by the attribute component 130. In an example embodiment, the simulation component 120 may construct one or more models of the geologic environment 150, which may be relied on to simulate behavior of the geologic environment 150 (e.g., responsive to one or more acts, whether natural or artificial). In the example of FIG. 1, the analysis/visualization component 142 may allow for interaction with a model or model-based results (e.g., simulation results, etc.). As an example, output from the simulation component 120 may be input to one or more other workflows, as indicated by a workflow component 144.

As an example, the simulation component 120 may include one or more features of a simulator such as the ECLIPSE™ reservoir simulator (Schlumberger Limited, Houston Tex.), the INTERSECT™ reservoir simulator (Schlumberger Limited, Houston Tex.), etc. As an example, a simulation component, a simulator, etc. may include features to implement one or more meshless techniques (e.g., to solve one or more equations, etc.). As an example, a reservoir or reservoirs may be simulated with respect to one or more enhanced recovery techniques (e.g., consider a thermal process such as SAGD, etc.).

In an example embodiment, the management components 110 may include features of a commercially available framework such as the PETREL® seismic to simulation software framework (Schlumberger Limited, Houston, Tex.). The PETREL® framework provides components that allow for optimization of exploration and development operations. The PETREL® framework includes seismic to simulation software components that can output information for use in increasing reservoir performance, for example, by improving asset team productivity. Through use of such a framework, various professionals (e.g., geophysicists, geologists, and reservoir engineers) can develop collaborative workflows and integrate operations to streamline processes. Such a framework may be considered an application and may be considered a data-driven application (e.g., where data is input for purposes of modeling, simulating, etc.).

In an example embodiment, various aspects of the management components 110 may include add-ons or plug-ins that operate according to specifications of a framework environment. For example, a commercially available framework environment marketed as the OCEAN® framework environment (Schlumberger Limited, Houston, Tex.) allows for integration of add-ons (or plug-ins) into a PETREL® framework workflow. The OCEAN® framework environment leverages .NET® tools (Microsoft Corporation, Redmond, Wash.) and offers stable, user-friendly interfaces for efficient development. In an example embodiment, various components may be implemented as add-ons (or plug-ins) that conform to and operate according to specifications of a framework environment (e.g., according to application programming interface (API) specifications, etc.).

FIG. 1 also shows an example of a framework 170 that includes a model simulation layer 180 along with a framework services layer 190, a framework core layer 195 and a modules layer 175. The framework 170 may include the commercially available OCEAN® framework where the model simulation layer 180 is the commercially available PETREL® model-centric software package that hosts OCEAN® framework applications. In an example embodiment, the PETREL® software may be considered a data-driven application. The PETREL® software can include a framework for model building and visualization.

As an example, a framework may include features for implementing one or more mesh generation techniques. For example, a framework may include an input component for receipt of information from interpretation of seismic data, one or more attributes based at least in part on seismic data, log data, image data, etc. Such a framework may include a mesh generation component that processes input information, optionally in conjunction with other information, to generate a mesh.

In the example of FIG. 1, the model simulation layer 180 may provide domain objects 182, act as a data source 184, provide for rendering 186 and provide for various user interfaces 188. Rendering 186 may provide a graphical environment in which applications can display their data while the user interfaces 188 may provide a common look and feel for application user interface components.

As an example, the domain objects 182 can include entity objects, property objects and optionally other objects. Entity objects may be used to geometrically represent wells, surfaces, bodies, reservoirs, etc., while property objects may be used to provide property values as well as data versions and display parameters. For example, an entity object may represent a well where a property object provides log information as well as version information and display information (e.g., to display the well as part of a model).

In the example of FIG. 1, data may be stored in one or more data sources (or data stores, generally physical data storage devices), which may be at the same or different physical sites and accessible via one or more networks. The model simulation layer 180 may be configured to model projects. As such, a particular project may be stored where stored project information may include inputs, models, results and cases. Thus, upon completion of a modeling session, a user may store a project. At a later time, the project can be accessed and restored using the model simulation layer 180, which can recreate instances of the relevant domain objects.

In the example of FIG. 1, the geologic environment 150 may include layers (e.g., stratification) that include a reservoir 151 and one or more other features such as the fault 153-1, the geobody 153-2, etc. As an example, the geologic environment 150 may be outfitted with any of a variety of sensors, detectors, actuators, etc. For example, equipment 152 may include communication circuitry to receive and to transmit information with respect to one or more networks 155. Such information may include information associated with downhole equipment 154, which may be equipment to acquire information, to assist with resource recovery, etc. Other equipment 156 may be located remote from a well site and include sensing, detecting, emitting or other circuitry. Such equipment may include storage and communication circuitry to store and to communicate data, instructions, etc. As an example, one or more satellites may be provided for purposes of communications, data acquisition, etc. For example, FIG. 1 shows a satellite in communication with the network 155 that may be configured for communications, noting that the satellite may additionally or include circuitry for imagery (e.g., spatial, spectral, temporal, radiometric, etc.).

FIG. 1 also shows the geologic environment 150 as optionally including equipment 157 and 158 associated with a well that includes a substantially horizontal portion that may intersect with one or more fractures 159. For example, consider a well in a shale formation that may include natural fractures, artificial fractures (e.g., hydraulic fractures) or a combination of natural and artificial fractures. As an example, a well may be drilled for a reservoir that is laterally extensive. In such an example, lateral variations in properties, stresses, etc. may exist where an assessment of such variations may assist with planning, operations, etc. to develop a laterally extensive reservoir (e.g., via fracturing, injecting, extracting, etc.). As an example, the equipment 157 and/or 158 may include components, a system, systems, etc. for fracturing, seismic sensing, analysis of seismic data, assessment of one or more fractures, etc.

As mentioned, the system 100 may be used to perform one or more workflows. A workflow may be a process that includes a number of worksteps. A workstep may operate on data, for example, to create new data, to update existing data, etc. As an example, a workstep may operate on one or more inputs and create one or more results, for example, based on one or more algorithms. As an example, a system may include a workflow editor for creation, editing, executing, etc. of a workflow. In such an example, the workflow editor may provide for selection of one or more pre-defined worksteps, one or more customized worksteps, etc. As an example, a workflow may be a workflow implementable in the PETREL® software, for example, that operates on seismic data, seismic attribute(s), etc. As an example, a workflow may be a process implementable in the OCEAN® framework. As an example, a workflow may include one or more worksteps that access a module such as a plug-in (e.g., external executable code, etc.).

In reservoir simulation, the desire for increased computational power to simulate the flow dynamics of increasingly large and complex reservoir models generates a steady push to develop new simulation technology. The widespread availability of many-core computers and clusters today makes the scalability of reservoir simulators a differentiating factor. To achieve favorable performance from modern computing hardware where a large number of cores are interconnected in a non-uniform network, parallelism may be built into simulation software at many levels. The message passing interface (MPI) paradigm used to interconnect nodes in a cluster, and/or used within individual nodes, may be combined with other kinds of parallel computing technologies to effectively harness the computing power available in clusters where each computing system may contain tens to hundreds of cores. The advances in hardware demand further advances in computational methods.

Current state of the art reservoir simulators are mostly based on a fully implicit formulation of the mass balance equations for the reservoir fluids where large sparse and ill-conditioned linear systems are solved iteratively for each timestep. By applying preconditioners, algebraic multigrid solvers, and a software framework that is designed for parallelism, good parallel performance can be achieved.

Embodiments of the present disclosure may provide, among other things, a hybrid parallel strategy for a multiscale solver that has been implemented in a reservoir simulator. For the multiscale solver, there are several possibilities for algorithm parallelization because the coarse grid provides independent domains to perform concurrent computations. Also presented herein is a distributed memory parallel implementation of the multiscale solver by using an MPI framework available in the simulator. The hybrid parallel multiscale solver is capable of harnessing the power of modern clusters with many-core computing systems.

Multiscale Method

The simulator framework is based on a fully implicit compositional formulation of the mass balance equations for multiple fluid components distributed in one or more phases. In this framework, an alternative solver engine is implemented that employs a sequential implicit formulation. This solver can be iterated to converge to the same solution as the fully implicit solver, if desired. This numerical formulation enables the use of a multiscale solver for pressure that effectively computes pressure and mass conservative fluxes.

The application of multiscale methods in reservoir simulation uses the possibility to formulate an elliptic or parabolic pressure equation that enables a sequential update of primary variables at the end of the timestep: first pressure is computed, then, using a multi-phase extension of Darcy's law, phase fluxes are computed before the fluid composition, i.e., phase saturations and component molar fractions, are updated.

The sequential pressure equation yields a set of discrete nonlinear equations that are solved to obtain the reservoir pressure $p^{n+1}$ at the end of a timestep. For brevity, the nonlinear equations can be written as $$(p^{n+1})=0. \quad (1)$$

To solve these equations, linearize the above nonlinear equation (1), set p1=pn and use a Newton-Raphson iteration.

$$p_{v+1}=p_v J_v^{-1}(p_v), v=1, \quad (2)$$

to reduce the norm of the pressure residual $\|F(p_{v+1})\|$ to a sufficiently small value. This may demand repeated large, sparse, and possibly ill-conditioned linear systems, and this could be where much of the run time is spent in a reservoir simulator. To solve this efficiently, an algebraic multiscale solver can be used that computes fit for purpose prolongation operators P that are used to map between the pressures in the simulation grid and degrees of freedom $x_c$ at a coarser scale. The coarse scale can be defined by a partitioning of the cells into non-overlapping simply connected subdomains called coarse blocks. Each column in P (called a basis function) is associated with one coarse block and has compact support. The basis functions approximate the solution of a homogeneous problem for the pressure Jacobian $J_v$ in the vicinity of the coarse blocks, i.e., $Jv\phi i \approx 0$.

Together, the basis functions form a discrete partition of unity and are used to approximate the pressure pv+1=Px.

Each linear system Jv (pv+1 pv)=Fp(pv) can then be approximated at a coarse level by $$RJ_vPxc=(pv), \quad (3)$$

where R is a restriction operator that can either be a PT or a finite-volume restriction operator that sums equations associated with each coarse block. The coarse linear system Eq. (3) is smaller and easier to solve than Eq. (2). The multiscale pressure update Pxc can approximate the global characteristics of the solution such as the combined effect of injection and production wells, aquifers, barriers to flow, and highly permeable regions, etc. To obtain an accurate solution of Eq. (2), the multiscale approximation is combined with an efficient smoother, e.g., ILU(0), that reduces the local high frequency errors.

After reservoir pressure has been computed, fluxes are computed. This can be achieved by a direct application of the multiphase extension of Darcy's law, or by solving local boundary value problems for each coarse block, with boundary conditions defined by fine grid phase fluxes computed from the reservoir pressure. The latter approach will, under certain conditions, give mass conservative fluxes.

Then, the saturations and molar fractions are computed at the end of the timestep by solving nc 1 component conservation equations (where nc is the number of components), with phase fluxes written in terms of total flux. The conservation equations are linearized and each linear system is solved approximately by a non-overlapping Schwarz method with a direct method as a subdomain solver. This enables parallel execution of the domains.

Hybrid Parallel Strategy

The hybrid parallelization strategy can use both a message-passing system for parallel computing (e.g., MPI) and multi-platform shared memory multiprocessing (e.g., using the OpenMP application programming interface (API)). Message-passing processes are employed for domain decomposition over distributed memory systems, and within each domain shared memory threads are used for concurrent calculations.

Using a message-passing system for parallel computing, data can be decomposed into smaller parts (i.e., domains) and processes can be run independently and concurrently on different cores, processors, and/or computer systems. This is not just advantageous in terms of speed gain, but also minimizes memory requirements of individual machines. This can be used for solving large data sets which are otherwise prohibitively slow and resource expensive on single devices.

The parallel implementation of the sequential implicit multiscale algorithm uses a distributed parallel simulator framework that is based on domain decomposition. This framework enables parallel initialization, property computation and flash calculation, communication of primary variables between processes, and also a parallel library for linear algebra and linear solvers. A benefit of working in this reservoir simulator is that many of these parallel capabilities are available and automatically enabled.

To parallelize the sequential implicit multiscale solver, the serial implementation can be extended. The boundaries of coarse grids used by the multiscale algorithm can configured to coincide with the boundaries of domains.

Then, the multiscale algorithm can be formulated in terms of linear algebra operations such as matrix-vector and matrix-matrix products. This allows a working solver to be quickly achieved that leverages the existing parallel linear algebra framework to handle communications between processes in an efficient manner.

In order to favorably use both parallel technologies, shared memory threads are spawned within each process in the hybrid approach.

Major and time consuming components of computation in the simulation engine are divided into pressure, flux, and transport routines. The components can include methods of handling the assembly and further solving of linear systems, various computations, and updates of properties and solutions. Shared memory parallelization can be applied to these methods. The accumulation term is assembled over the fine cells within a domain, whereas flux term assembly is over the coarse cells. The linear solvers in the flux and transport parts can be direct solvers that operate on independent matrices over each coarse cell. The construction of pressure and transport matrices and corresponding right hand sides, as part of the compute preceding the direct solver step, is over the connections between the cells. Depending on the method, work with varying grain size is concurrently executed by multiple threads. There are several other less major methods involved in calculation of norms, residuals, checking convergence criteria, and well matrix calculations, etc., which are also parallelized over various levels of granularity. Programming effort is reduced by taking advantage of a variety of available independent loops.

Thus, shared memory parallelism provides advantages, such as automatic handling of threads, low overhead of parallelization, ease of usage, etc.

Figure 2:
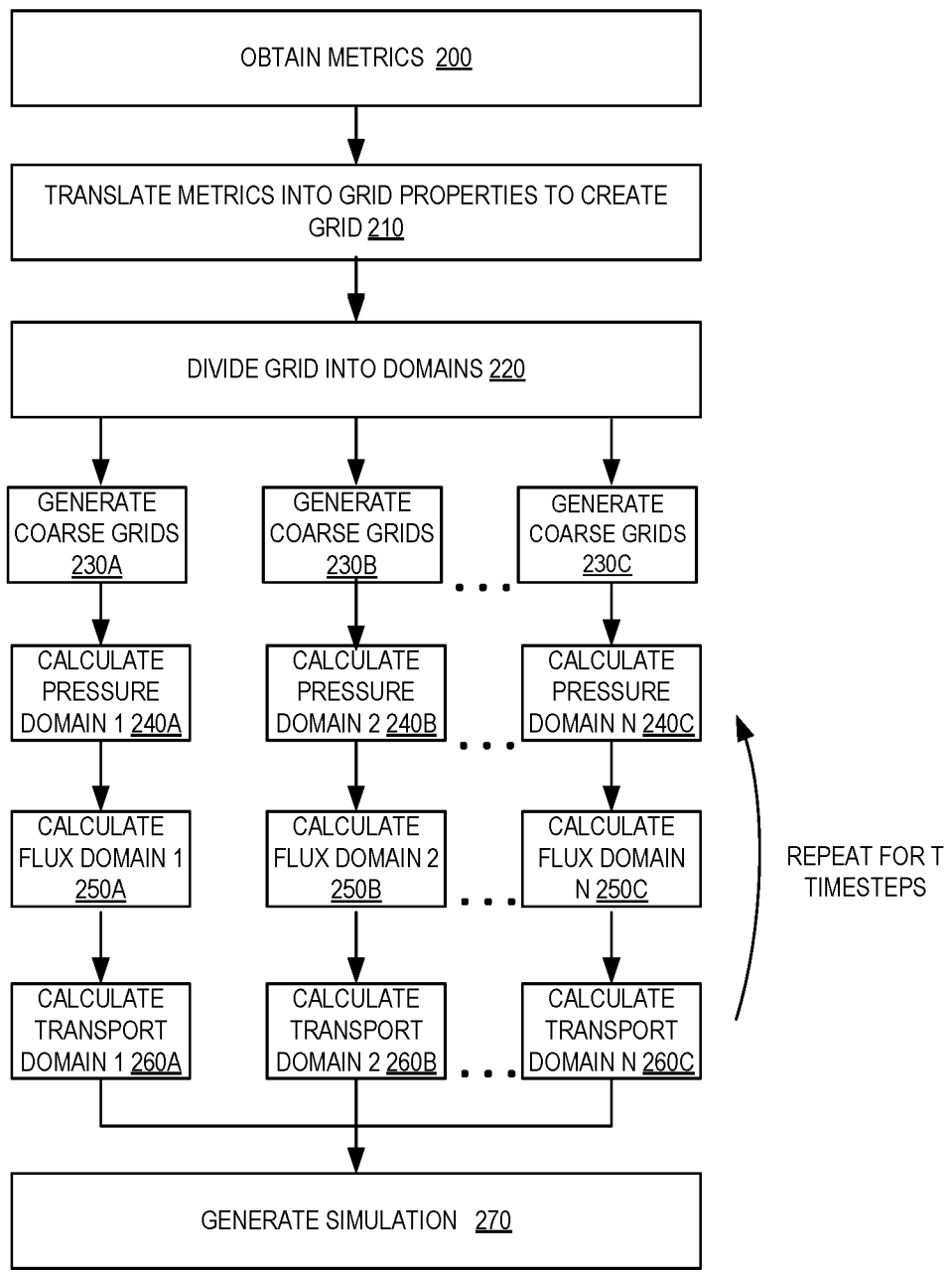
FIG. 2 illustrates an example of a method for performing a parallel multiscale reservoir simulation, according to an embodiment.

FIG. 2 illustrates an example of a method for performing a parallel multiscale reservoir simulation, according to an embodiment. In some embodiments, the example method illustrated in FIG. 2 can be performed using a computing device that includes the framework (e.g., framework 170) and the management components (e.g., management components 110) described above with reference to FIG. 1.

The example method can begin in 200, when the computing device obtains data representing a geographical area (e.g., metrics of a subterranean formation, such as a reservoir) that is being simulated. The data may include measured properties of a reservoir determined using, for example, core samples, seismic analysis, nuclear magnetic resonance, gamma ray logging, any other type of well logging, etc. Such properties can be collected using various devices, such as well-logging tools, logging-while-drilling devices, seismic receivers (e.g., geophones), imaging devices, and the like. Measured properties can include, for example, rock type, porosity, permeability, pore volume, volumetric flow rates, well pressure, gas/oil ratio, composition of fluid in the reservoir, etc.

In 210, the computing device can translate the obtained metrics into grid properties for a grid that represents the geographical area. For example, the metrics can include oil volumes, water volumes, gas volumes, etc., associated with geological formations. Based on the associated geological coordinates, the volumes can be assigned as grid properties of specific grid segments within the grid. In some embodiments, the grid can correspond to a reservoir model, such as a generalized reservoir model, a black-oil model, a compositional model, a thermal model, an implicit pressure, a single-porosity model, a dual-porosity model, etc.

In 220, the computing device can divide the grid into multiple domains. In some embodiments, the computing device can divide the grid into n domains, where n is the number of cores, processors, or computer systems that will be used to perform the simulation. In other embodiments, the number of domains can be based on, for example, a user-selected value, the size of the geographical area, the amount of metrics to be used for the simulation, the properties to be determined by the simulation, the type of reservoir model, the number of timesteps to be performed, etc.

As an example, the grid can be divided into domains using algorithms for partitioning unstructured graphs, meshes, and for computing fill-reducing orderings of sparse matrices, such as ParMETIS.

In some embodiments, a domain can be associated with one or more adjacent and/or connecting grid segments within the grid. Additionally, domains associated with grid segments that are adjacent and/or connected to grid segments in another domain can store indications of which domains and/or grid segments are adjacent and/or connected.

In various embodiments, metrics, grid properties, etc. associated with an individual domain can be sent to or otherwise processed by an individual processor of multiple processors on the computing device, by an individual core of multiple cores on the computing device, and/or on devices that are in communication with the computing device.

In 230A, 230B, and 230C, the computing device and/or one or more other computer systems that are in communication with the computing device can generate coarse grids based on the domains, for example, using methods described above. 230A, 230B, and 230C can represent that coarse grids are generated for the different domains using different cores, processors, and/or computer systems. 230A, 230B, and 230C can be performed for any number of cores, processors, and/or computer systems (N). As described above, the number of domains, in some embodiments, can be equal to the number of cores, processors, or computer systems. Thus, each core, processor, or computer system can generate the coarse grids in parallel. In other embodiments, the course grids can be generated substantially in parallel, in sequence, partially in parallel using fewer cores, processors, and/or computer systems than domains, etc.

In various embodiments, multiple sets of coarse grids of different granularities can be generated for a single domain for simulating a reservoir using a multiscale method, using methods described above. For example, a domain may represent a 10×10 segment of the grid corresponding to the reservoir. A 10×10 segment is merely a simplified example, and, in various embodiments, the domain may represent an N×M segment, where N and M can be any number (including the same number). The 10×10 segment may be coarsened into a 2×2 grid and the same 10×10 segment may also be coarsened into a 4×4 grid. As part of the multiscale method, the 2×2 grid could be used to calculate pressure and flux throughout the domain and the 4×4 grid may be used to calculate transport throughout the domain.

In 240A, 240B, and 240C, the computing device and/or one or more other computer systems that are in communication with the computing device can calculate pressure for the different domains. 240A, 240B, and 240C can represent that the pressure is calculated for individual domains using different cores, processors, and/or computer systems. 240A, 240B, and 240C can be performed for any number of cores, processors, or computer systems (N). Each core, processor, and/or computer system can calculate pressure within the corresponding domain in parallel. In other embodiments, the pressure within domains can be calculated substantially in parallel, in sequence, partially in parallel using fewer cores, processors, and/or computer systems than domains, etc.

In some embodiments, the pressure can be calculated using coarse grids generated in 230A, 230B, and 230C. For example, the domain may correspond to a 10×10 grid, but the pressure can be calculated using a 2×2 coarse grid based on the 10×10 grid. In various embodiments, the pressure can be calculated for each coarse block within the coarse grid using an algebraic multiscale solver, as described above. Additionally, in some implementations, the pressure for one domain can be solved using multiple cores and/or multiple processors use shared memory and/or by communicating information associated with adjacent grids that are processed by other cores, processors, and/or computer systems, as described in further detail below.

In 250A, 250B, and 250C, the computing device and/or one or more other computer systems can calculate flux for the different domains. 250A, 250B, and 250C can represent that the flux is calculated for individual domains using different cores, processors, and/or computer systems. 250A, 250B, and 250C can be performed for any number of cores, processors, or computer systems (N). Each core, processor, and/or computer system can calculate flux within the corresponding domain in parallel. In other embodiments, the flux within domains can be calculated substantially in parallel, in sequence, partially in parallel using fewer cores, processors, and/or computer systems than domains, etc.

In some embodiments, the flux can be calculated using coarse grids generated in 230A, 230B, and 230C. For example, the domain may correspond to a 10×10 grid, but the flux can be calculated using a 2×2 coarse grid based on the 10×10 grid. In further embodiments, the flux can be calculated using the same coarse grid that is used to calculate the pressure in 240A, 240B, and 240C. In various embodiments, the flux can be calculated for each coarse block within the coarse grid using a multi-phase extension of Darcy's law, as described above. Additionally, in some implementations, the flux for one domain can be solved by using multiple cores and/or multiple processors that use shared memory and/or by communicating information associated with adjacent grids that are processed by other cores, processors, and/or computer systems, as described in further detail below.

In 260A, 260B, and 260C, the computing device and/or one or more other computer systems can calculate transport of fluids for the different domains. 260A, 260B, and 260C can represent that the computing device is calculating the transport of fluids for individual domains using different cores, processors, and/or computer systems. 260A, 260B, and 260C can be performed for any number of cores, processors, or computer systems (N). Each core, processor, and/or computer system can calculate transport of fluids within the corresponding domain in parallel. In other embodiments, the transport of fluids within domains can be calculated substantially in parallel, in sequence, partially in parallel using fewer cores, processors, and/or computer systems than domains, etc.

In some embodiments, the transport can be calculated using coarse grids generated in 230A, 230B, and 230C. For example, the domain may correspond to a 10×10 grid, but the transport can be calculated using a 4×4 coarse grid based on the 10×10 grid. In further embodiments, the transport can be calculated using a different coarse grid than the course grid(s) used to calculate the pressure in 240A, 240B, and 240C and/or the flux in 250A, 250B, and 250C. In various embodiments, the transport can be calculated for each coarse block within the coarse grid, as described above. Additionally, in some implementations, the transport for one domain can be solved by using multiple cores and/or multiple processors that use shared memory and/or by communicating information associated with adjacent grids that are processed by other cores, processors, and/or computer systems, as described in further detail below.

In some embodiments, the completion of 240A, 240B, and 240C, 250A, 250B, and 250C, and 260A, 260B, and 260C can represent the completion of a single timestep of a reservoir simulation. According, 240A, 240B, and 240C, 250A, 250B, and 250C, and 260A, 260B, and 260C can be performed for each timestep, where T represents the number of timesteps. In some embodiments, each iteration of 240A, 240B, and 240C, 250A, 250B, and 250C, and 260A, 260B, and 260C can use the results from the previous timestep.

In various embodiments, the reservoir simulation is completed after each of the timesteps have been performed.

In 270, the computing device can complete the reservoir simulation by, in some embodiments, displaying the simulated reservoir and/or generating print files that can be used by reservoir simulation software to display or otherwise use the simulation data. For example, each timestep can be associated with an image or video rendering of the reservoir based on simulated grid properties (e.g., volumes of gas, oil, water, etc.) of individual grids within the reservoir.

Figure 3:
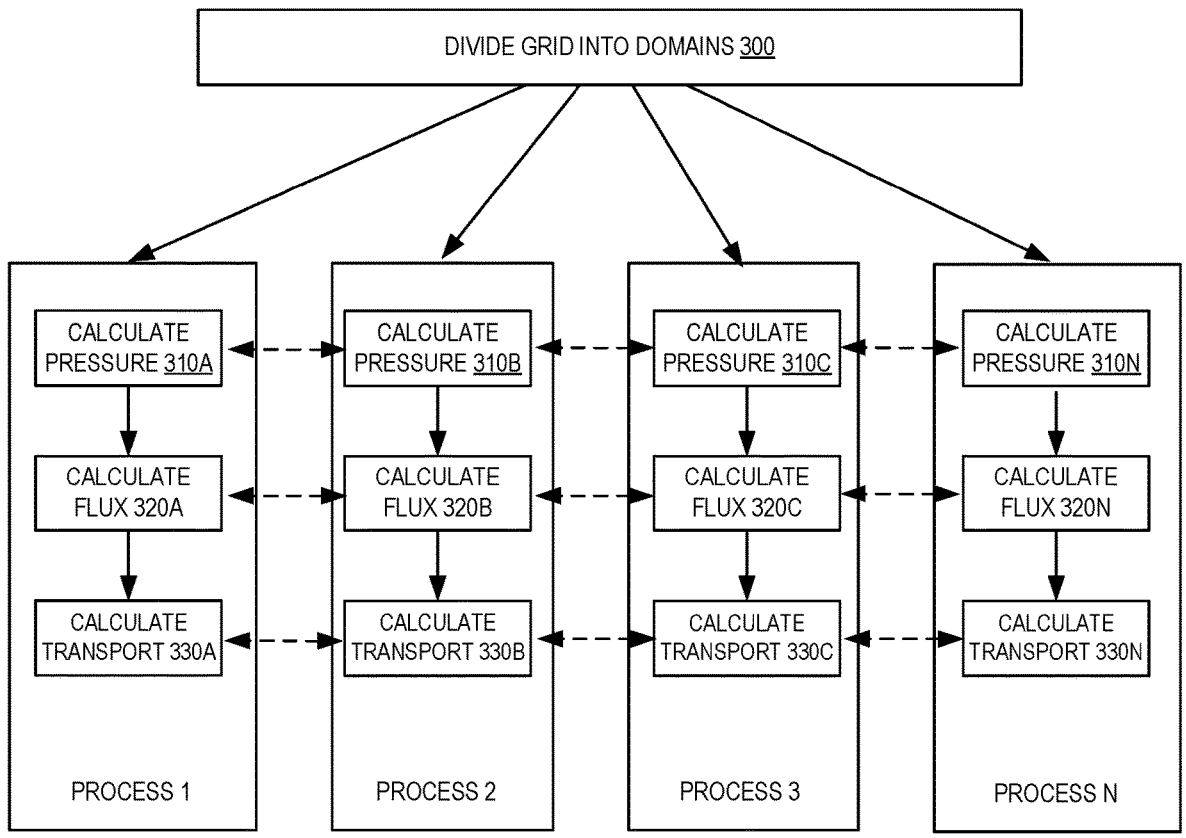
FIG. 3 illustrates an example of a method for dividing a reservoir into multiple domains and simulating the multiple domains in parallel, according to an embodiment.

FIG. 3 illustrates an example of a method for dividing a reservoir into multiple domains and simulating the multiple domains in parallel, according to an embodiment. In some embodiments, the example method illustrated in FIG. 3 can be performed using one or more computer systems that include the framework (e.g., framework 170) and the management components (e.g., management components 110) described above with reference to FIG. 1.

The example method can begin in 300, when, similar to 220 in FIG. 2, the computing device divides a grid representing a reservoir into multiple domains. In some embodiments, the computing device can divide the grid into N domains, where N is the number of cores, processors, or computer systems that will be used to perform the simulation. In other embodiments, the number of domains can be based on, for example, a user-selected value, the size of the geographical area, the amount of metrics to be used for the simulation, the properties to be determined by the simulation, the type of reservoir model, the number of timesteps to be performed, etc.

In various embodiments, each domain can correspond to a process, where a process is an instance of a computer program that is being executed. For example, as shown in FIG. 3, the grid can be divided into four or more domains/processes, where process N represents a single process (e.g., process 4) or represents multiple additional processes (e.g., process 4, process 5, process 6, etc.).

Each process can be processed using an individual core, processor, and/or computer system. For example, process 1 can be processed using a first computer system, process 2 can be processed using a second computer system, process 3 can be processed using a third computer systems, and process N can be processed using one or more other computer systems.

Each computer system may have one or more processors and shared memory between processors and each processor may have one or more cores and shared memory between cores.

Accordingly, calculating pressure in 310A can be processed in parallel with 310B, 310C, and 310N on the different computer systems. Additionally, during the pressure calculation, information can be shared between the multiple computer systems. For example, the domain associated with process 1 can be adjacent to the domain associated with process 2 in the grid. Accordingly, pressure information associated with one domain can affect pressure information associated with the adjacent domain and other domains in the grid and updated pressure information can be communicated by the computer system as the pressure is being calculated.

Similarly, calculating flux in 320A can be processed in parallel with 320B, 320C, and 320N, and calculating transport in 330A can be processed in parallel with 330B, 330C, and 330N on different computer systems. During the flux and/or transport calculation, information can be shared and/or communicated between the multiple computer systems (e.g., between computer systems calculating flux and/or transport for adjacent domains and other domains in the grid).

Figure 4:
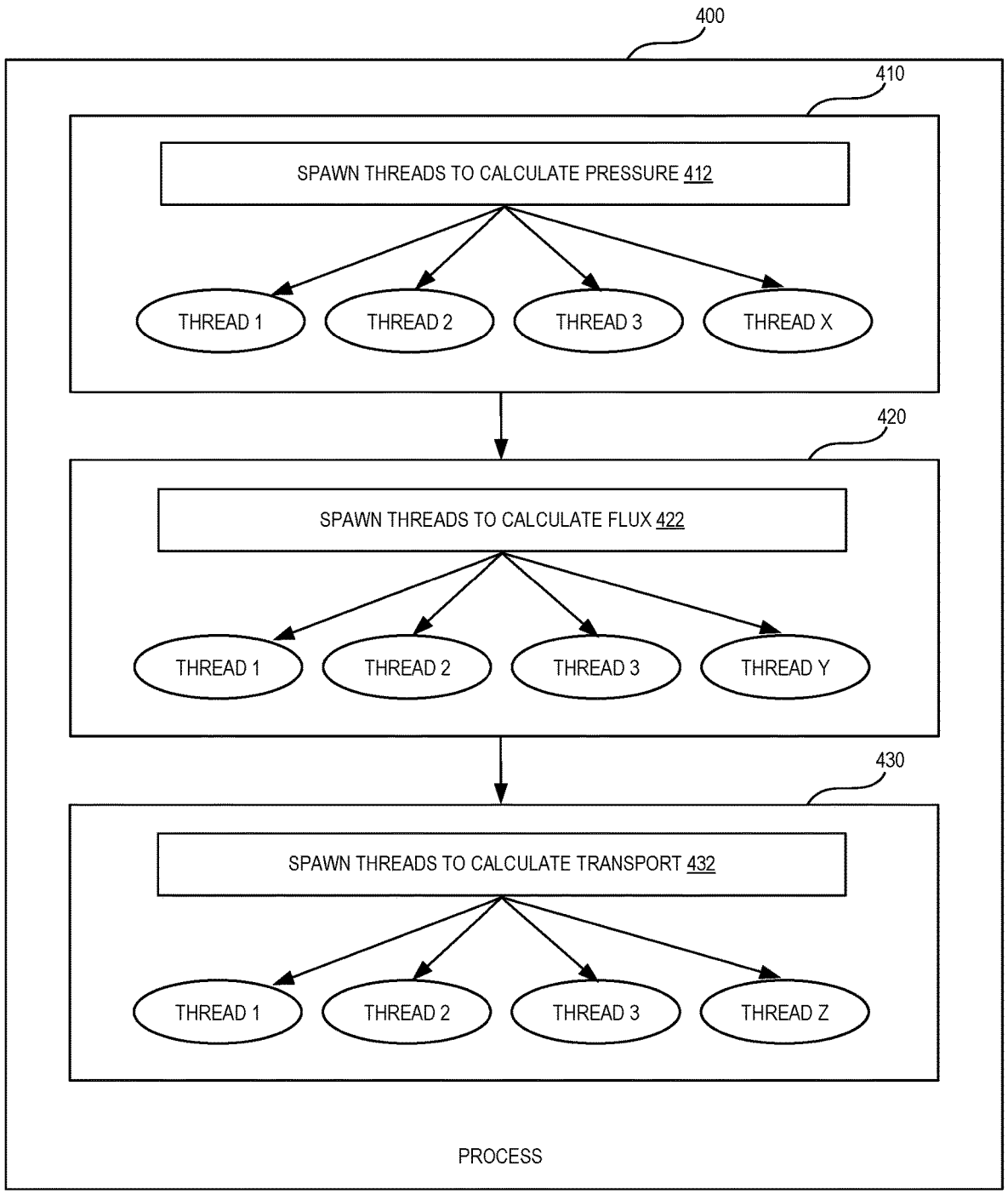
FIG. 4 illustrates an example of a method for spawning threads of a process for simulating a reservoir using multiple cores, according to an embodiment.

FIG. 4 illustrates an example of a method for spawning threads of a process for simulating a reservoir using multiple cores, according to an embodiment. In some embodiments, the example method illustrated in FIG. 4 can be performed using a computer system that includes the framework (e.g., framework 170) and the management components (e.g., management components 110) described above with reference to FIG. 1.

The example method can correspond to a process 400, which can be, for example, one of process 1, process 2, process 3, or process N shown in FIG. 3. Accordingly, the process 400 can correspond to a domain that is part of a grid that is being simulated.

In some embodiments, the process 400 can be assigned to one computer system of multiple computer systems that are used for simulating a reservoir, and the computer system can include multiple cores on one or more processors.

In 410, the computer system can calculate pressure for the domain. In some embodiments, as part of the pressure computation, in 412, the computer system can spawn threads (e.g., thread 1, thread 2, thread 3, thread X, etc.), where threads are programmed instructions that can be managed independently by a scheduler (e.g., an operating system scheduler or a threading technology scheduler (e.g., OpenMP, ThreadPool, Threading Building Blocks (TBB), etc.)). Accordingly, using the scheduler, individual threads can be sent to individual cores of the computer system, and some threads can be executed in parallel with other threads via the multiple cores.

In some embodiments, certain threads can be distributed among multiple cores of the same processor, allowing the threads to utilize shared memory of the processor. Thus, the threads can have access to the same stored variables even if the threads are executed on different cores.

In further embodiments, the computer system can spawn threads at multiple points during the pressure computation. For example, the computer system can spawn threads corresponding to an initialization sequence, and the initialization sequence can be broken down into a large number of small workloads (i.e., fine-grain parallelism). The threads for the small workloads can be distributed among the available cores of the computer system.

Additionally, the computer system can spawn threads corresponding to a sequence for assembling a computation matrix and spawn threads corresponding to a sequence for solving auxiliary systems or solving linear systems. These sequences can be broken down into a smaller number of larger workloads (i.e., coarse-grain parallelism). The threads for the larger workloads can be distributed among the available cores of the computer system.

Further, the computer system can spawn threads corresponding to a sequence for updating solutions and properties, and the sequence can be broken down into a combination of small workloads and large workloads. The threads can be distributed among the available cores of the computer system.

In 420, the computer system can calculate flux for the domain. In some embodiments, as part of the flux computation, in 422, the computer system can spawn threads (e.g., thread 1, thread 2, thread 3, thread Y, etc.). Accordingly, using the scheduler, individual threads can be sent to individual cores of the computer system, and some threads can be executed in parallel with other threads via the multiple cores.

In some embodiments, certain threads can be distributed among multiple cores of the same processor, allowing the threads to utilize shared memory of the processor.

In further embodiments, the computer system can spawn threads at multiple points during the flux computation. For example, the computer system can spawn threads corresponding to an initialization sequence, a sequence for assembling linear systems, a sequence for solving linear systems, a sequence for updating solutions and properties, etc.

In 430, the computer system can calculate transport for the domain. In some embodiments, as part of the transport computation, in 432, the computer system can spawn threads (e.g., thread 1, thread 2, thread 3, thread Z, etc.). Accordingly, using the scheduler, individual threads can be sent to individual cores of the computer system, and some threads can be executed in parallel with other threads via the multiple cores.

In some embodiments, certain threads can be distributed among multiple cores of the same processor, allowing the threads to utilize shared memory of the processor.

In further embodiments, the computer system can spawn threads at multiple points during the transport computation. For example, the computer system can spawn threads corresponding to an initialization sequence, a sequence for assembling linear systems, a sequence for solving linear systems, a sequence for updating solutions and properties, etc.

Figure 5:
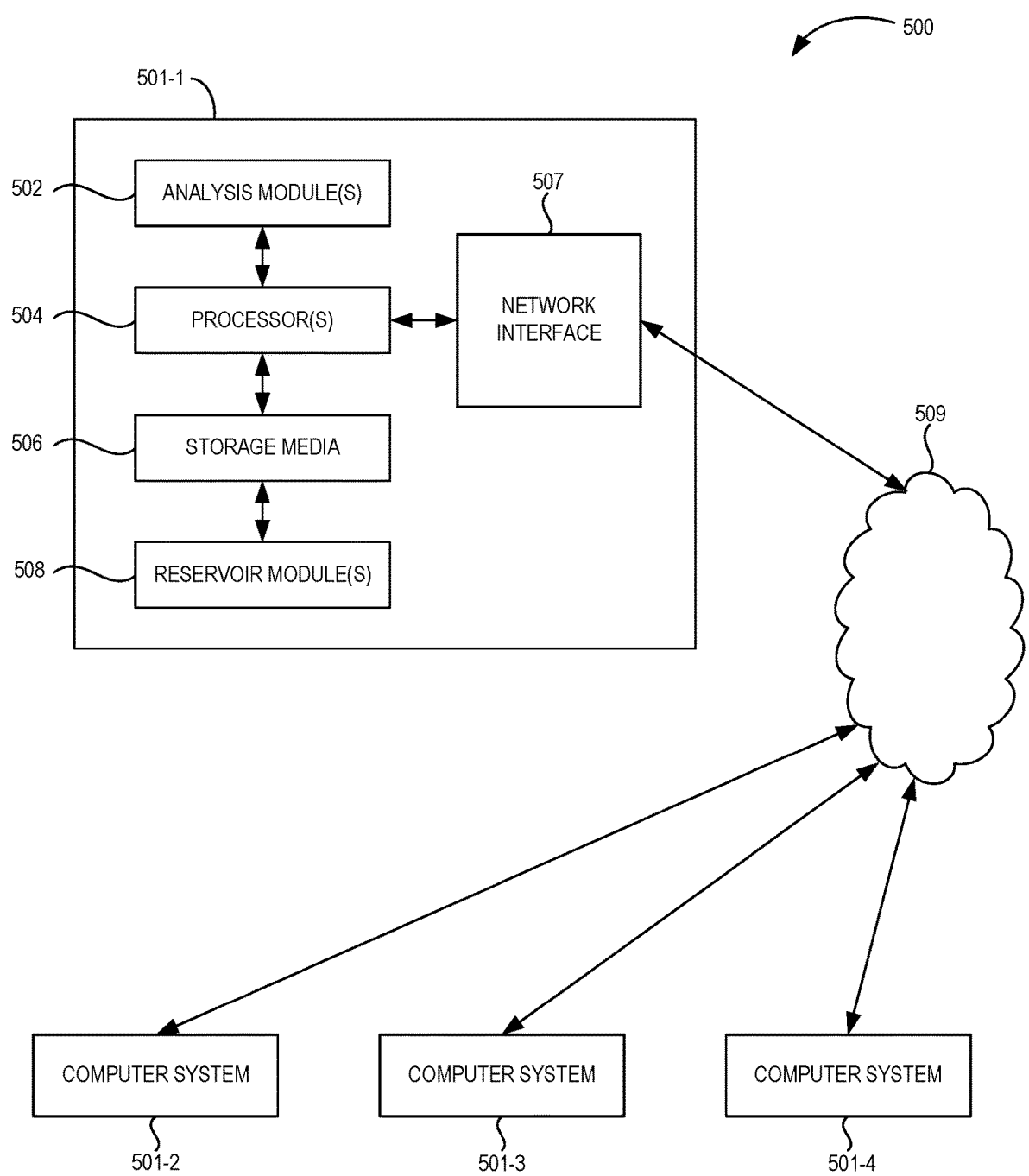
FIG. 5 illustrates an example computing system that may execute methods of the present disclosure, according to an embodiment.

In some embodiments, the methods of the present disclosure may be executed by a computing system. FIG. 5 illustrates an example of such a computing system 500, in accordance with some embodiments. The computing system 500 may include a computer system 501-1, which may be an individual computer system 501-1 or an arrangement of distributed computing systems (e.g., for parallel computing). The computer system 501-1 includes one or more analysis modules 502 that are configured to perform various tasks according to some embodiments, such as one or more methods disclosed herein. To perform these various tasks, the analysis module 502 executes independently, or in coordination with, one or more processors 504, which is (or are) connected to one or more storage media 506 and can include one or more cores (not shown). The processor(s) 504 is (or are) also connected to a network interface 507 to allow the computer system 501-1 to communicate over a data network 509 with one or more additional computer systems, such as 501-2, 501-3, and/or 501-4 (note that computer systems 501-2, 501-3, and/or 501-4 may or may not share the same architecture as computer system 501-1, and may be located in different physical locations, e.g., computer systems 501-1 and 501-2 may be located in a processing facility, while in communication with one or more computer systems such as 501-3 and/or 501-4 that are located in one or more data centers, and/or located in varying countries on different continents).

A processor may include a microprocessor, microcontroller, processor module or subsystem, programmable integrated circuit, programmable gate array, or another control or computing device.

The storage media 506 may be implemented as one or more computer-readable or machine-readable storage media. Note that while in the example embodiment of FIG. 5 storage media 506 is depicted as within computer system 501-1, in some embodiments, storage media 501-1 may be distributed within and/or across multiple internal and/or external enclosures of computer system 501-1 and/or additional computing systems. Storage media 506 may include one or more different forms of memory including semiconductor memory devices such as dynamic or static random access memories (DRAMs or SRAMs), erasable and programmable read-only memories (EPROMs), electrically erasable and programmable read-only memories (EEPROMs) and flash memories, magnetic disks such as fixed, floppy and removable disks, other magnetic media including tape, optical media such as compact disks (CDs) or digital video disks (DVDs), BLURAY® disks, or other types of optical storage, or other types of storage devices. Note that the instructions discussed above may be provided on one computer-readable or machine-readable storage medium, or, may be provided on multiple computer-readable or machine-readable storage media distributed in a large system having possibly plural nodes. Such computer-readable or machine-readable storage medium or media is (are) considered to be part of an article (or article of manufacture). An article or article of manufacture may refer to any manufactured single component or multiple components. The storage medium or media may be located either in the machine running the machine-readable instructions, or located at a remote site from which machine-readable instructions may be downloaded over a network for execution.

In some embodiments, computing system 500 contains reservoir simulation module(s) 508 for obtaining and storing reservoir metrics, generating models, dividing the reservoir into domains and/or coarse grids, spawning threads, performing timesteps, generating reservoir simulations, etc. In the example of computing system 500, computer system 501-1 includes the reservoir simulation module 508. In some embodiments, a single reservoir simulation module may be used to perform aspects of one or more embodiments of the methods disclosed herein. In alternate embodiments, a plurality of reservoir simulation modules may be used to perform aspects of methods disclosed herein.

It should be appreciated that computing system 500 is one example of a computing system, and that computing system 500 may have more or fewer components than shown, may combine additional components not depicted in the example embodiment of FIG. 5, and/or computing system 500 may have a different configuration or arrangement of the components depicted in FIG. 5. The various components shown in FIG. 5 may be implemented in hardware, software, or a combination of both hardware and software, including one or more signal processing and/or application specific integrated circuits.

Further, parts of the processing methods described herein may be implemented by running one or more functional modules in information processing apparatus such as general purpose processors or application specific chips, such as ASICs, FPGAs, PLDs, or other appropriate devices. These modules, combinations of these modules, and/or their combination with general hardware are included within the scope of protection of the disclosure.

Geologic interpretations, models, and/or other interpretation aids may be refined in an iterative fashion; this concept is applicable to the methods discussed herein. This may include use of feedback loops executed on an algorithmic basis, such as at a computing device (e.g., computing system 500, FIG. 5), and/or through manual control by a user who may make determinations regarding whether a given action, template, model, or set of curves has become sufficiently accurate for the evaluation of the subsurface three-dimensional geologic formation under consideration.

The foregoing description, for purpose of explanation, has been described with reference to specific embodiments. However, the illustrative discussions above are not intended to be exhaustive or limited to the precise forms disclosed. Many modifications and variations are possible in view of the above teachings. Moreover, the order in which the elements of the methods described herein are illustrated and described may be re-arranged, and/or two or more elements may occur simultaneously. The embodiments were chosen and described in order to explain principals of the disclosure and practical applications, to thereby enable others skilled in the art to utilize the disclosure and various embodiments with various modifications as are suited to the particular use contemplated.

What is claimed is:

1. A method, comprising:
obtaining reservoir data;
translating the reservoir data into grid properties to create a grid;
dividing the grid into domains;
generating coarse grids corresponding to each of the domains;
processing, using one or more processors, the domains, wherein processing a domain comprises:
calculating pressure for the domain using a coarse grid corresponding to the domain;
calculating flux for the domain using a coarse grid corresponding to the domain; and
calculating transport of fluids for the domain using a coarse grid corresponding to the domain; and
generating a reservoir simulation corresponding to the grid based on processing each domain, wherein:
the calculating of the pressure, the flux, and the transport of fluids for all of the domains represent a single respective timestep and are performed in parallel.

2. The method of claim 1, wherein the grid is divided into a number of domains that correspond to at least one of a number of available computer systems, a number of available processors, and a number of available cores.

3. The method of claim 1, wherein the generating of the coarse grids corresponding to each domain comprises generating coarse grids of different granularities for each domain.

4. The method of claim 1, wherein the processing of the domains comprises processing the domains in parallel on at least one of different computer systems, different processors, or different cores.

5. The method of claim 4, wherein the processing of the domains comprises communicating information between the different computer systems, the different processors, or the different cores during the calculating the pressure, the flux, and the transport of fluids.

6. The method of claim 1, wherein the calculating of the pressure, the flux, and the transport of fluids for each of the domains comprises spawning threads for processing using a plurality of cores.

7. The method of claim 6, wherein the threads are scheduled for execution on the plurality of cores using an operating system scheduler or a threading technology scheduler.

8. The method of claim 6, wherein the threads utilize shared memory of a processor corresponding to the plurality of cores.

9. The method of claim 1, wherein:
each iteration of the calculating of the pressure, the flux, and the transport of fluids uses results from a previous timestep.

10. A computing system comprising:
one or more processors; and
a memory system comprising one or more non-transitory, computer-readable media storing instructions that, when executed by at least one of the one or more processors, cause the computing system to perform operations, the operations comprising:
obtaining reservoir data;
translating the reservoir data into grid properties to create a grid;
dividing the grid into domains;
generating coarse grids corresponding to each of the domains;
processing the domains, wherein processing a domain comprises:
calculating pressure for the domain using a coarse grid corresponding to the domain;
calculating flux for the domain using a coarse grid corresponding to the domain; and
calculating transport of fluids for the domain using a coarse grid corresponding to the domain; and
generating a reservoir simulation corresponding to the grid based on processing each of the domains, wherein:
the calculating of the pressure, the flux, and the transport of fluids for all of the domains represent a single respective timestep and are performed in parallel.

11. The computing system of claim 10, wherein the grid is divided into a number of domains that correspond to at least one of a number of available computer systems, a number of available processors, and a number of available cores.

12. The computing system of claim 10, wherein the generating of the coarse grids corresponding to each domain comprises generating coarse grids of different granularities for each domain.

13. The computing system of claim 10, wherein the processing of the domains comprises processing the domains in parallel on at least one of different computer systems, different processors, or different cores.

14. The computing system of claim 13, wherein the processing of the domains comprises communicating information between the different computer systems, the different processors, or the different cores during the calculating of the pressure, the flux, and the transport of fluids.

15. The computing system of claim 10, wherein the calculating of the pressure, the flux, and the transport of fluids for each domain comprises spawning threads for processing using a plurality of cores.

16. The computing system of claim 15, wherein the threads are scheduled for execution on the plurality of cores using an operating system scheduler or a threading technology scheduler.

17. The computing system of claim 15, wherein the threads utilize shared memory of a processor corresponding to the plurality of cores.

18. The computing system of claim 10, wherein:
each iteration of the calculating of the pressure, the flux, and the transport of fluids uses results from a previous timestep.

19. A non-transitory, computer-readable medium storing instructions that, when executed by one or more processors of a computing system, cause the computing system to perform operations, the operations comprising:
obtaining reservoir data;
translating the reservoir data into grid properties to create a grid;
dividing the grid into domains;
generating coarse grids corresponding to each of the domains;
processing the domains, wherein processing a domain comprises:
calculating pressure for the domain using a coarse grid corresponding to the domain;
calculating flux for the domain using a coarse grid corresponding to the domain; and
calculating transport of fluids for the domain using a coarse grid corresponding to the domain; and
generating a reservoir simulation corresponding to the grid based on processing each domain, wherein:
the calculating of the pressure, the flux, and the transport of fluids for all of the domains represent a single respective timestep and are performed in parallel.

20. The non-transitory, computer-readable medium of claim 19, wherein the generating of the coarse grids corresponding to each of the domains comprises generating coarse grids of different granularities for each of the domains.

* * * * *